(12) United States Patent
Tohyama et al.

(10) Patent No.: US 9,159,271 B2
(45) Date of Patent: Oct. 13, 2015

(54) ILLUMINATION DEVICE AND LIQUID CRYSTAL DISPLAY DEVICE

(71) Applicant: LIQUID DESIGN SYSTEMS INC., Kouhoku-ku, Yokohama-shi (JP)

(72) Inventors: Naoya Tohyama, Yokohama (JP); Makoto Kurihara, Yokohama (JP)

(73) Assignee: LIQUID DESIGN SYSTEMS INC., Yokohama-Shi, Kanagawa (JP)

( * ) Notice: Subject to any disclaimer, the term of this patent is extended or adjusted under 35 U.S.C. 154(b) by 0 days.

(21) Appl. No.: 14/130,174

(22) PCT Filed: Apr. 11, 2013

(86) PCT No.: PCT/JP2013/060909
§ 371 (c)(1),
(2) Date: Dec. 30, 2013

(87) PCT Pub. No.: WO2013/154151
PCT Pub. Date: Oct. 17, 2013

(65) Prior Publication Data
US 2014/0132891 A1    May 15, 2014

(30) Foreign Application Priority Data
Apr. 11, 2012  (JP) .................. 2012-090077

(51) Int. Cl.
*G02F 1/1335* (2006.01)
*G09G 3/34* (2006.01)
(Continued)

(52) U.S. Cl.
CPC .......... *G09G 3/342* (2013.01); *G02F 1/133603* (2013.01); *G02F 1/133608* (2013.01); *G09G 3/3426* (2013.01); *H01L 25/0753* (2013.01); *H05B 33/0803* (2013.01);
(Continued)

(58) Field of Classification Search
CPC ............ G02F 1/133603; G02B 6/0068; G02B 6/0073
USPC ................................ 349/61, 64, 69; 362/612
See application file for complete search history.

(56) References Cited

U.S. PATENT DOCUMENTS

2008/0036940 A1*  2/2008  Song et al. ...................... 349/61
2010/0053046 A1*  3/2010  Nakanishi ...................... 345/82
(Continued)

FOREIGN PATENT DOCUMENTS

JP      2002335019 A    3/2001
JP      2007214214 A    2/2006
(Continued)

*Primary Examiner* — Thanh-Nhan P Nguyen
(74) *Attorney, Agent, or Firm* — R. Neil Sudol; Henry D. Coleman

(57) ABSTRACT

An illumination device includes a metal base substrate in a flat planar shape, a plurality of LED modules, and a driving unit which drives each of the LEDs arranged on the metal base substrate. The LED modules have an organic substrate, a plurality of LEDs which are arranged on the organic substrate, a metal member, LED control signal terminals which are set on the edge of the organic substrate, and voltage feed terminals which are set on the edge of the organic substrate. The metal member corresponds to each LED and to which the heat from the LEDs is conducted, and which is electrically connected via a switch element from an electrode of the LED, and which penetrates the organic substrate toward its width direction from the LED mounting surface of the organic substrate and is exposed from the opposite surface.

7 Claims, 23 Drawing Sheets

(51) Int. Cl.
  *H01L 25/075*  (2006.01)
  *H05K 1/02*  (2006.01)
  *H05B 33/08*  (2006.01)
  *H01L 33/62*  (2010.01)
  *H01L 33/64*  (2010.01)
  *H05K 3/46*  (2006.01)

(52) U.S. Cl.
  CPC ........... *H05B 33/086* (2013.01); *H05K 1/0204* (2013.01); *G02F 2001/133612* (2013.01); *G02F 2001/133628* (2013.01); *G09G 2320/0626* (2013.01); *G09G 2360/16* (2013.01); *H01L 33/62* (2013.01); *H01L 33/642* (2013.01); *H01L 2924/0002* (2013.01); *H05K 3/4644* (2013.01); *H05K 2201/10106* (2013.01); *H05K 2201/10416* (2013.01)

(56) References Cited

U.S. PATENT DOCUMENTS

| | | | |
|---|---|---|---|
| 2011/0316010 A1* | 12/2011 | Baba et al. | 257/88 |
| 2012/0026424 A1* | 2/2012 | Youk et al. | 349/62 |
| 2013/0258251 A1* | 10/2013 | Lee et al. | 349/69 |

FOREIGN PATENT DOCUMENTS

| | | |
|---|---|---|
| JP | 2008041639 A | 8/2006 |
| JP | 2009237540 A | 3/2008 |
| JP | 2010054726 A | 8/2008 |
| WO | WO2009110456 A1 | 9/2009 |

* cited by examiner

ILLUMINATION DEVICE AND LIQUID CRYSTAL DISPLAY DEVICE

TECHNICAL FIELD

The present invention relates to an illumination device and a liquid crystal display device.

BACKGROUND ART

Conventionally, an LCD device where a plurality of LED substrates on which LEDs are implemented are arranged in order on the back side of the LED panel, and which makes the maintenance easier, eliminates wasted space as well as prevents leakage of light from the LED as well as leakage of unnecessary radiation from the LED substrates is disclosed (refer to patent document 1).

As for the LED substrates described in the patent document 1, they are relatively small substrates on which a plurality of LEDs which are light source for backlights are implemented, and they are arranged in order on the back side of the LCD panel, and supported by a backlight chassis.

Further, a sheet-like heat conductive member is held between the backlight chassis and a chassis tray. Thus, the heat generated on the LED substrates is released through the backlight chassis and the chassis tray.

CITATION LIST

Patent Literature

PTL1: Japanese Patent Application Laid-Open No. 2010-60921

SUMMARY OF THE INVENTION

Technical Problems Solved by the Invention

However the LCD display device in the patent document 1 requires a connection member between the substrates on the backsides of the LED substrates which are next to each other in order to electrically connect the LED substrates which are next to each other. Therefore, it becomes necessary to have the number of connection members corresponding to the number of LED substrates, and LED maintenance becomes complex.

Further, the sheet-like heat conductive member is held between the backlight chassis and a chassis tray and the cost increases.

The present invention is proposed, taking such problems into consideration, and without increasing the cost or labor, provides the lighting device and the LCD device whose LEDs can be replaced in easy steps.

Means for Solving the Problem

The illumination device of the present invention includes a metal base substrate in a flat planar shape, a plurality of LED modules, and a driving unit which drives each of the LEDs arranged on the metal base substrate. The LED modules have an organic substrate, a plurality of LEDs which are arranged on the organic substrate, a metal member, LED control signal terminals which are set on the edge of the organic substrate, and voltage feed terminals which are set on the edge of the organic substrate. The metal member corresponds to each LED and to which the heat from the LEDs is conducted, and which is electrically connected via a switch element from an electrode of the LED, and which penetrates the organic substrate toward its width direction from the LED mounting surface of the organic substrate and is exposed from the opposite surface. The LED modules are arranged along the row direction and the column direction so as to be capable of attaching to and detaching from the metal base substrate. The LED control signal terminals and the power feed terminals are respectively connected to each other which are adjacent to each other in the row direction and in the column direction.

The liquid crystal display device of the present invention has a liquid crystal panel with a plurality of pixels which are arranged and the illumination device which emits light toward the liquid crystal panel.

Effect of the Invention

According to the present invention, LEDs are replaceable with simple steps without cost and labor.

DESCRIPTION OF EMBODIMENTS

Embodiments of the present invention are explained as follow.

First Embodiment

Figure 1:
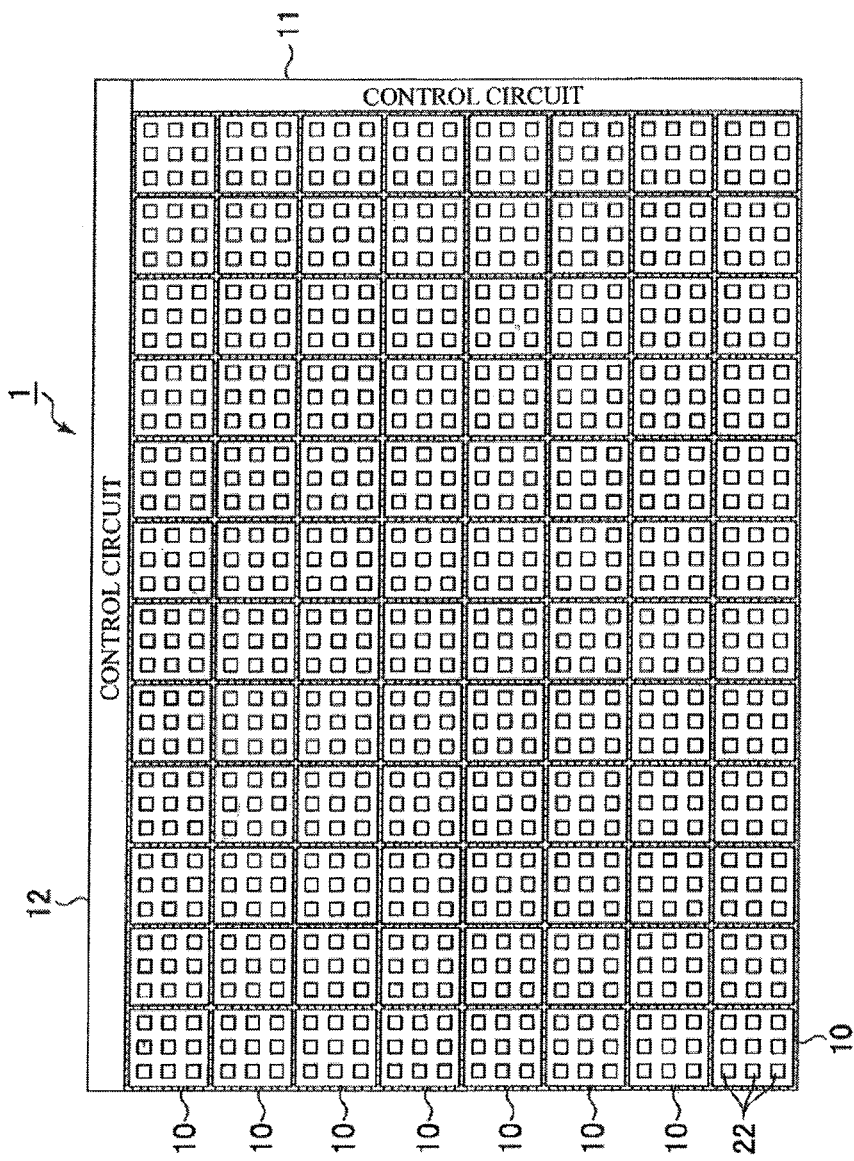
FIG. 1 is a front view of the backlight device according to an embodiment of the present invention.

FIG. 1 is a front view of the backlight device 1 according to the first embodiment of the present invention. The backlight device 1 includes a plurality of LED modules 10 on which a plurality of LEDs (Light Emitting Diodes) 22 are mounted and arranged in the row direction and the column direction (in a matrix form), a control circuit 11 which controls the driving of LEDs arranged in the row direction, and a control circuit 12 which controls the driving of LEDs arranged in the column direction.

As for the backlight device 1, as shown in FIG. 1, 96 pieces of LED modules 10 are mechanically and electrically connected to the aluminum base substrate 13 which is explained later. The LED modules 10 are formed so that the LED modules 10 are attachable to and detachable from the aluminum base substrate 13. The number of LED modules 10 is not specifically limited to a certain number.

Figure 2:
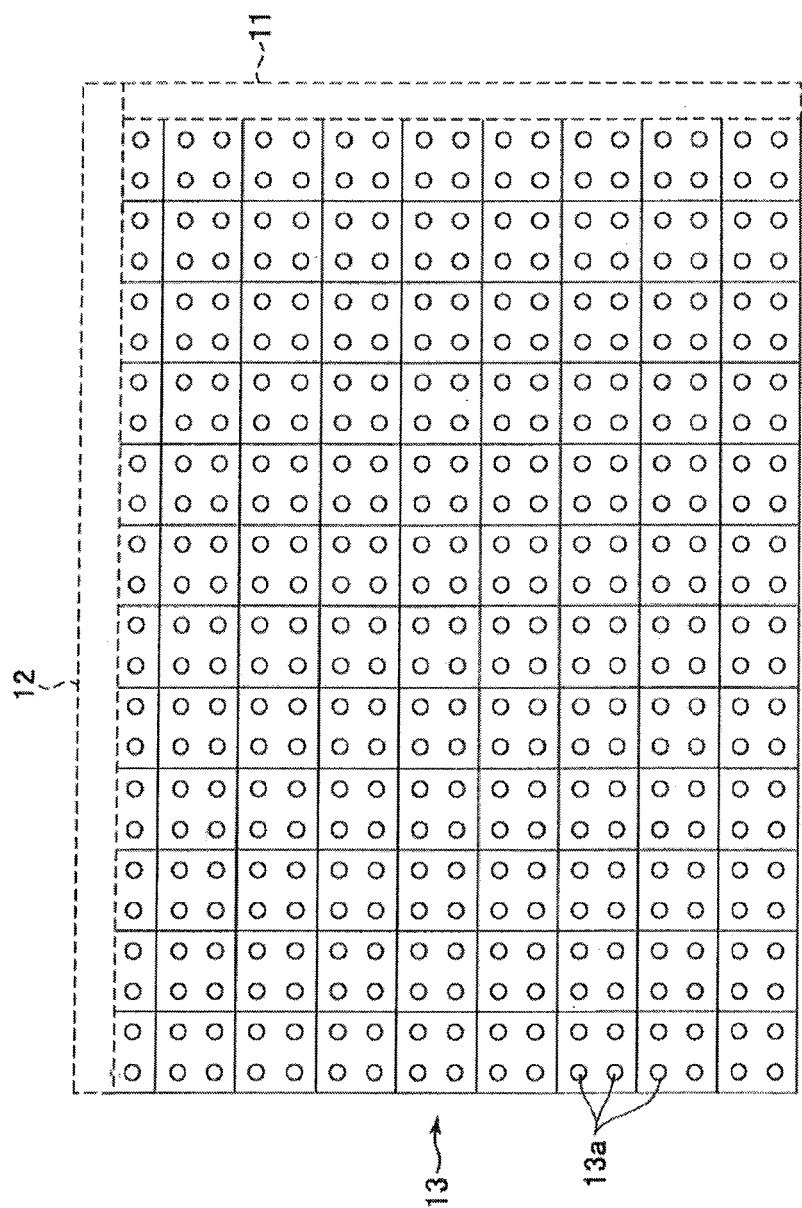
FIG. 2 is a front view of the aluminum base substrate which exposes when each LED module and a control circuit are removed from the backlight device.

FIG. 2 is a front view of the aluminum base substrate 13 which exposes when each LED module 10 and control circuits 11 and 12 are removed from the backlight device 1. The aluminum base substrate 13 has circular dents 13a which are arranged in the row direction and the column direction. Each circular dent 13a is large enough so that the circular bump-like connection part 24 (explained later) provided on the LED modules 10 fit in.

The aluminum base substrate 13 has a planar shape. In order to set the aluminum base substrate 13 and each LED module 10 in the right position, all needs to be done is to set the circular bump-like connection part 24 of the LED modules 10 into circular dents 13a of the aluminum base substrate 13.

Figure 3:
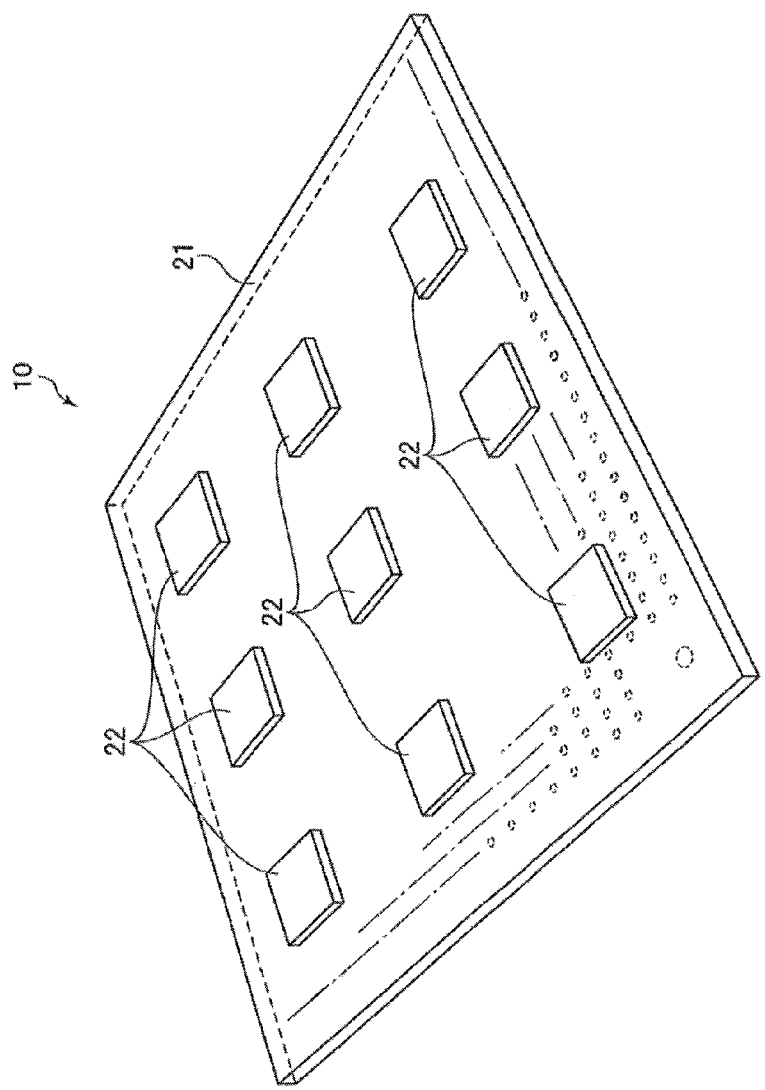
FIG. 3 is a perspective view of the LED module on the LED mounting (front surface) side.

FIG. 3 is a perspective view of the LED module 10 on the LED mounting (front surface) side. LED Module 10 has an organic substrate 21 in a planer shape, and one or more LEDs 22 (nine in this embodiment) provided on the organic substrate 21. The length and the width of the LED module 10 is, for example, assumed as both 2 inches in length and width, but it is changeable as desired depending on the size of the backlight device 1.

On the organic substrate 21, nine LEDs 22 are arranged in the row direction and the column direction so that their gaps are all equal. In this embodiment, the example where nine LEDs 22 are provided on the organic substrate 21 is explained. However, the number of LEDs 22 can be eight and less or ten and more, and it is not limited to a specific number. Also, the number of LEDs 22 on the organic substrate 21 is determined depending on the single LED 22's brightness, the brightness required by the backlight device 1, and the size of the illuminated area. Each LED 22 is driven independently and it is possible that each LED 22 has different brightness, duration of illumination time, and illuminating timing.

Figure 4:
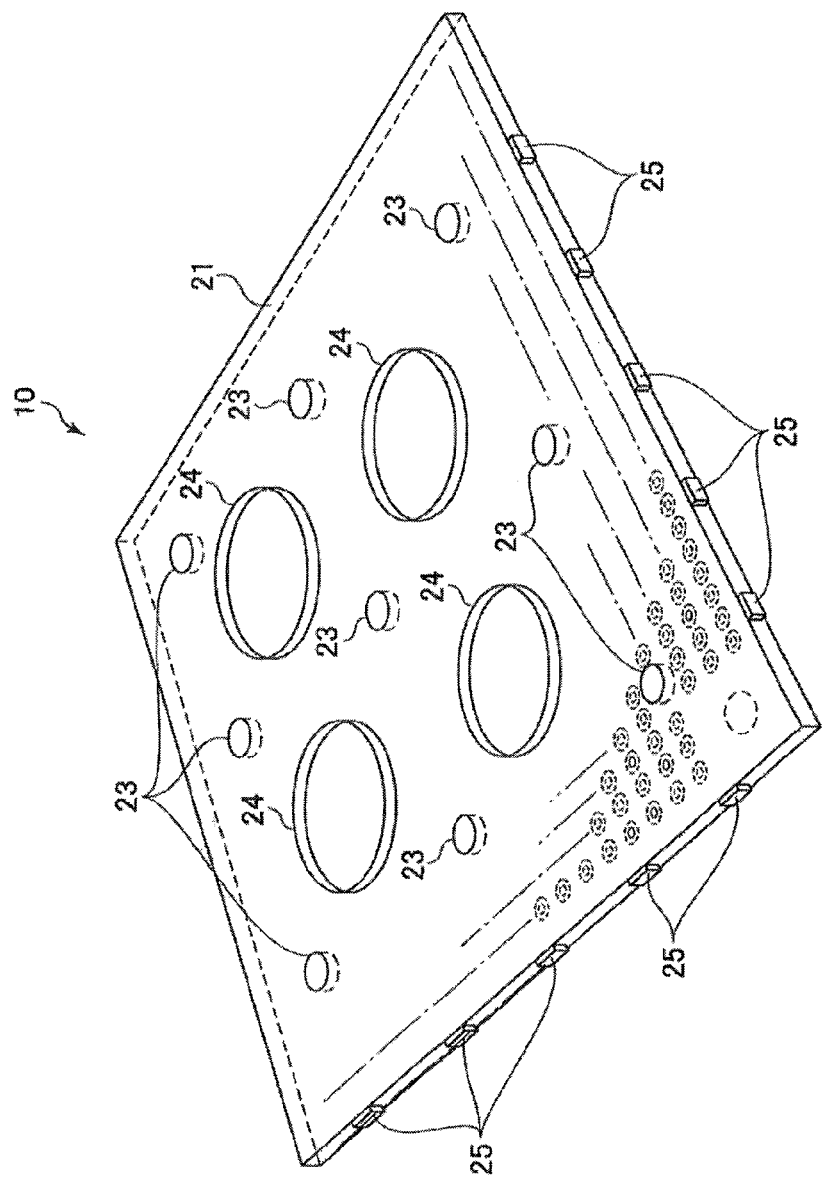
FIG. 4 is a perspective view of the LED module on the opposite side of the LED mounting (back surface) side.

FIG. 4 is a perspective view of the LED module 10 on the opposite side of the LED mounting (back surface) side. The LED module 10 has, on its backside, electrode aluminum pieces 23 which are connected to the other side of the electrode of the LEDs 22 indicated on FIG. 3, cylinder members 24 provided on the back side of the organic substrate 21, and interface terminals 25 provided on the edges of each side of the organic substrate 21.

Figure 6:
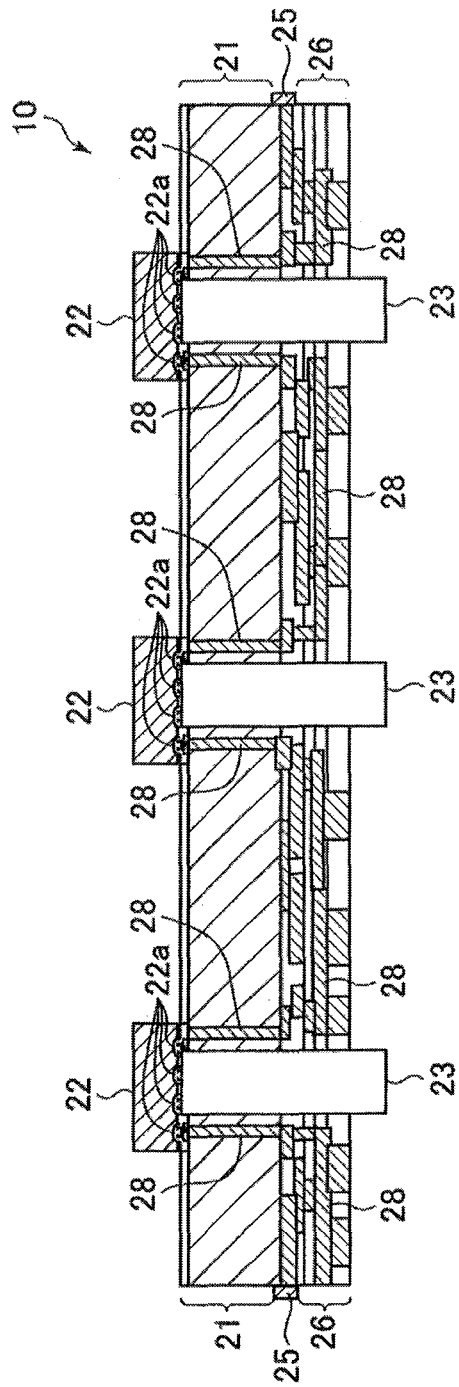
FIG. 6 is a sectional view of the LED module.

The electrode aluminum pieces 23 are electrically connected to the negative poles of the LEDs 22 via a field effect transistor (FET) and micro bumps 22a (see FIG. 6). Also, the electrode aluminum pieces 23 releases heat from LEDs 22 externally as well as when connected to the aluminum base substrate 13 which is ground potential, the electrode aluminum pieces 23 serve as ground potential.

Four Cylinder members 24 are provided on the backside of the organic substrate 21. The diameter of the cylinder members 24 is smaller than the diameter of circular dent portion 13a provided on the aluminum base substrate 13 as shown in FIG. 2.

For example, five interface internal terminals 25 are provided on the edge of four sides of the organic substrate 21. The interface internal terminals 25 has interface functionality in order to electrically connect to the adjacent LED module 10, and for example, serve as control line connection, power supply line connection, and spare terminals.

Figure 5:
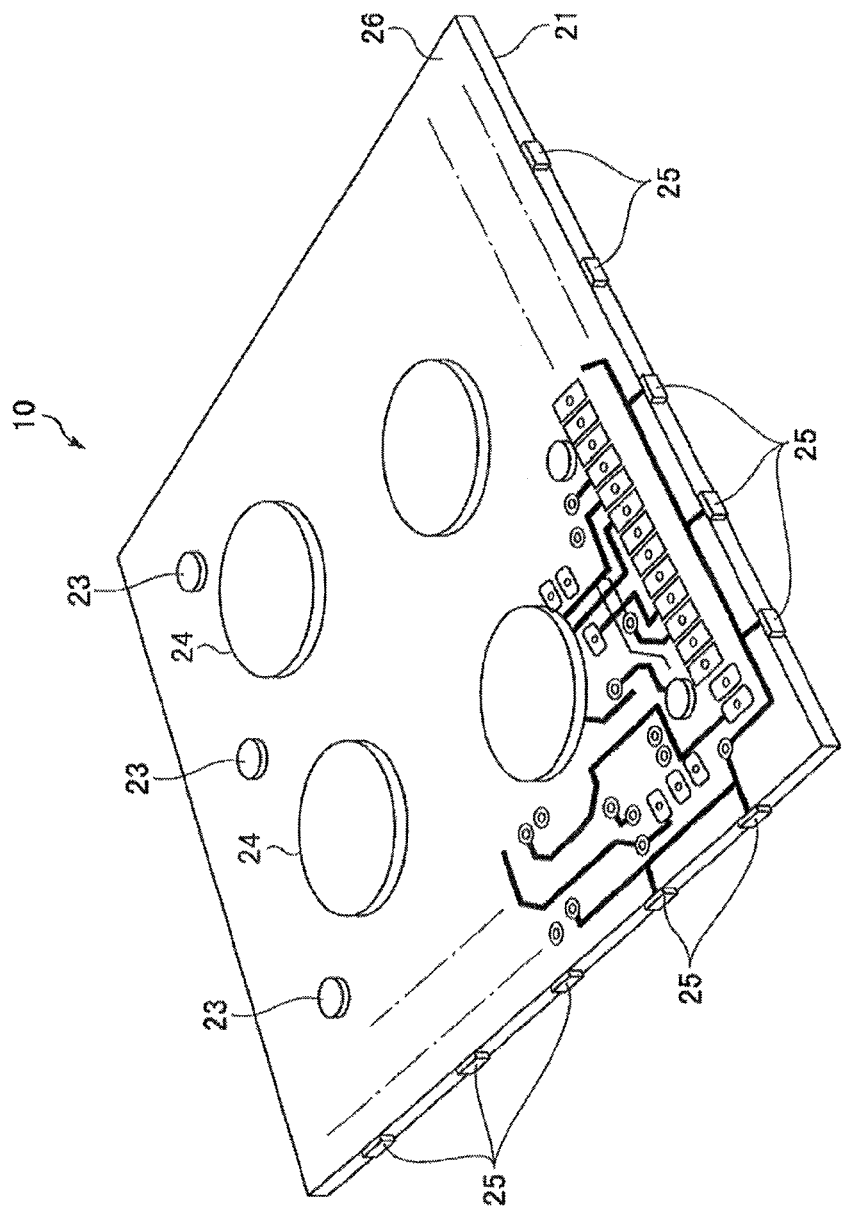
FIG. 5 is a view of when multi-layer substrates are set on the backside of the LED module.

FIG. 5 is a view of when a multi-layer substrate 26 is set on the backside of the LED module 10 as shown in FIG. 4. FIG. 6 is a sectional view of the LED module 10 shown in FIG. 5. As shown in the figures, the organic substrate 21 has the wirings 28. On the backside of the organic substrate 21, the multi-layer substrate 26 which has wiring 28 is set. LEDs 22 are connected to either wirings 28 or electrode aluminum pieces 23 via micro bumps 22a.

Figure 7:
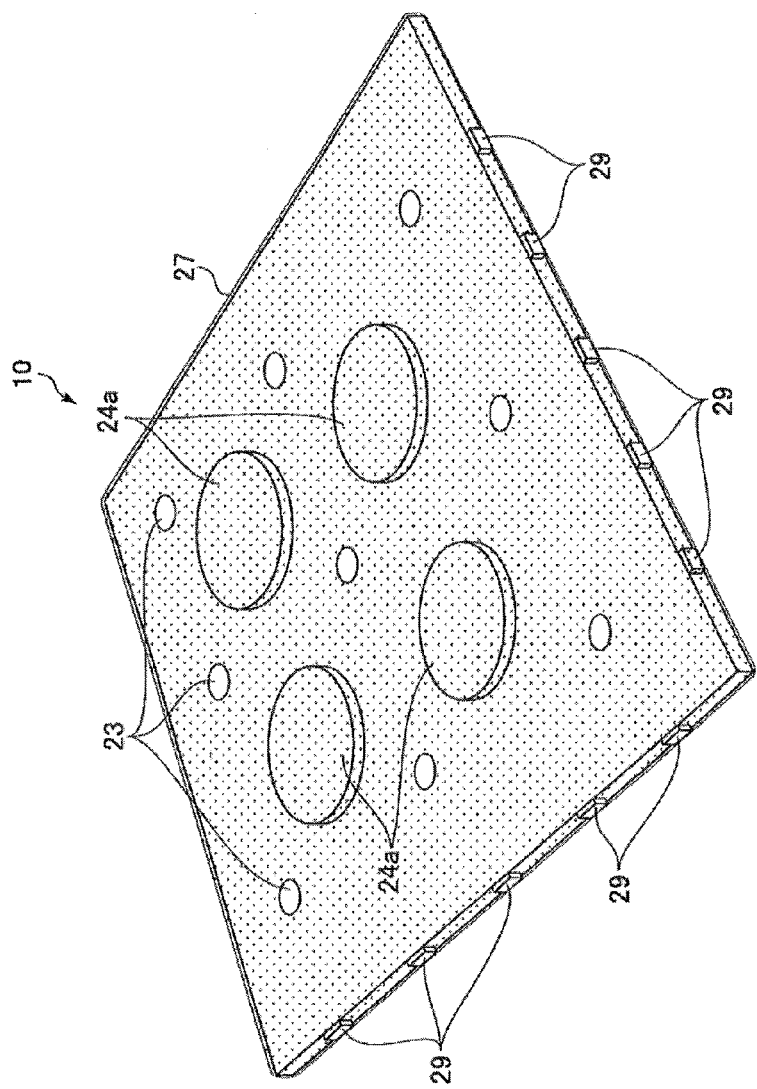
FIG. 7 is a view when an insulation cover is put on the backside of the LED module.
Figure 8:
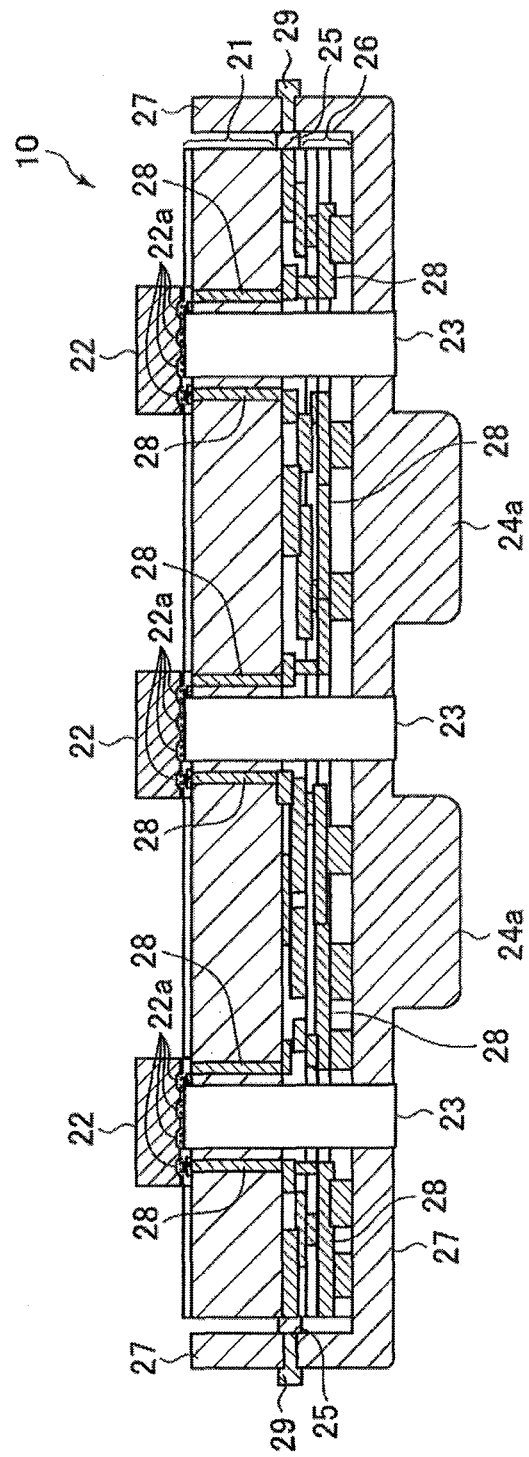
FIG. 8 is a sectional view of the LED module.

FIG. 7 is a view when an insulation cover 27 is put on the backside of the LED module 10. FIG. 8 is a sectional view of the LED module 10. As shown in FIGS. 7 and 8, LED module 10 has an electrode aluminum piece 23, an insulation cover 27 whose backside is covered, and a plurality of interface external terminals 29. Each interface external terminal 29 is connected to a corresponding interface internal terminal 25.

In short, as shown in FIG. 8, the interface external terminals 29 are connected to interface connection points 25 via wirings 28, penetrating or going across the insulation cover 27. As such, when each LED module 10 is arranged on the aluminum base substrate 13, adjacent interface external terminals 29 are electrically connected with each other, and control lines and power supply lines are connected between the adjacent LED modules 10 in the row direction and in the column direction.

When the insulation cover 27 is covered by the cylinder member 24 as shown in FIG. 5, circular bump-like connection parts 24a are formed as shown in FIG. 7 and FIG. 8. The circular bump-like connection parts 24a are formed so that the circular bump-like connection parts 24a fit into the circular dent sections 13a on the aluminum base substrate 13 shown in FIG. 2. And as the circular bump-like connection parts 24a fit into the circular dent sections 13a, the LED module 10 and the aluminum base substrate 13 are properly positioned and aligned.

Figure 9:
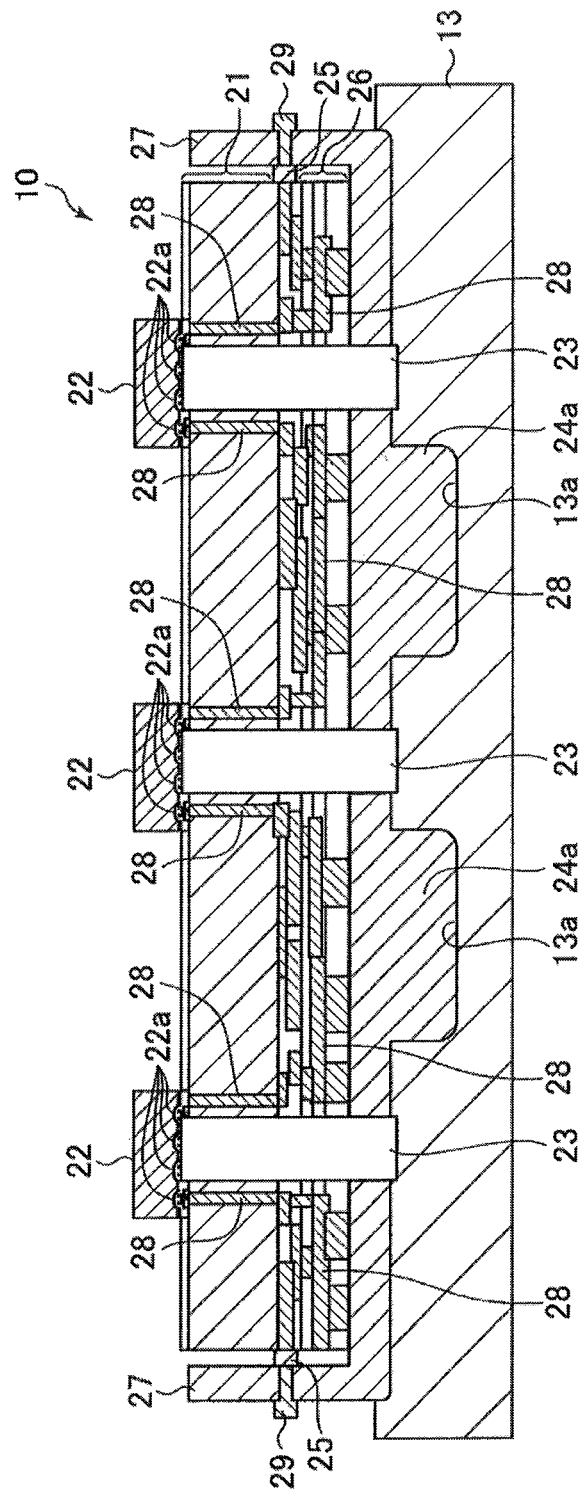
FIG. 9 is a sectional view of the LED module and the aluminum base substrate to which circular bump-like connection parts are set inside the circular dent sections.

FIG. 9 is a sectional view of an LED module 10 and the aluminum base substrate 13 to which the circular bump-like connection parts 24a are set inside the circular dent sections 13a.

When the circular bump-like connection parts 24a are set inside the circular dent sections 13a, the electrode aluminum piece 23 is connected to the aluminum base substrate 13. By this, the heat generated by LEDs 22 is released to the aluminum base substrate 13 via micro bumps 22a, and being conducted to the electrode aluminum piece 23. Also, one side of the electrode of LEDs 22 is grounded via a field effect transistor (FET) which is not shown in the figure.

As explained above, the backlight device 1 has a plurality of LED modules 10 which are attachable to and detachable from the aluminum substrate 13. By this, in the event that any voluntary LED 22 is broken, only the LED module which includes the broken LED 22 needs to be replaced, thus, the maintenance of the backlight device 1 is easy, and the yield improves. Also, by arranging the LED modules 10 which can be mass produced at low cost, the production cost of backlight device 1 remains low.

Figure 10A:
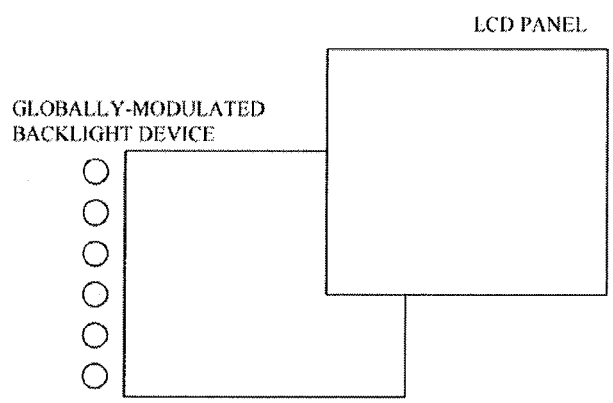
FIG. 10A is a view which shows a globally-modulated backlight device.
Figure 10B:
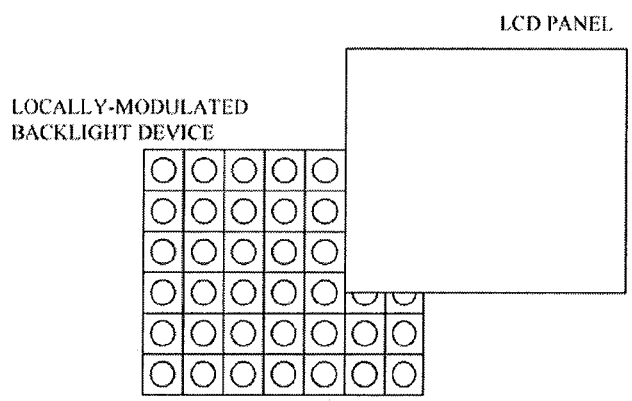
FIG. 10B is a view of a locally-modulated backlight device.
Figure 10C:
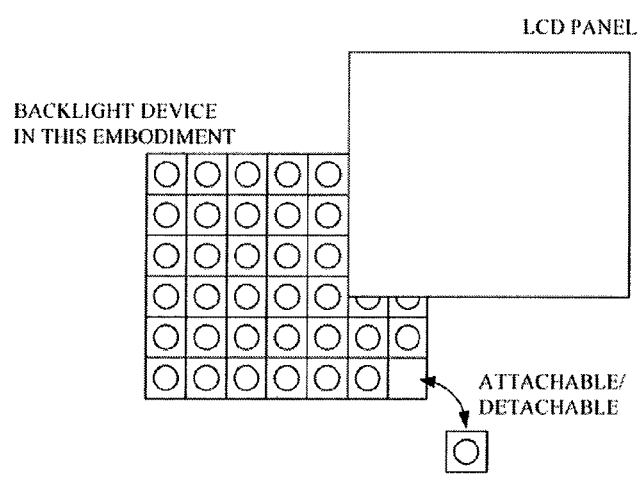
FIG. 10C is a view of the backlight device achieved by the present invention.

FIG. 10A is a view which shows a globally-modulated backlight device. FIG. 10B is a view of a locally-modulated backlight device. FIG. 10C is a view of the backlight device in this embodiment.

The globally-modulated backlight device has power source LEDs which are arranged on the edge and modulates the brightness globally. Since the LEDs are arranged on the edge, the globally-modulated backlight device is easily applied to thin display applications, and is usable for small-size LCD devices, such as portable phones and automotive displays.

The locally-modulated backlight device has LEDs arranged all over the screen (two-dimensional) and modulates the brightness locally on the screen. Since it is possible to control the brightness of the LEDs precisely and locally, the locally-modulated backlight device has a higher contrast in brightness compared to the globally-modulated device and is usable to large LCD devices, such as TVs.

On the contrary, the backlight device 1 in this embodiment is a locally-modulated device, and the LED modules 10 on which a plurality of LEDs are mounted are formed in an attachable/detachable manner. Thus, the backlight device 1 in this embodiment has higher contract in brightness compared to the conventional globally-modulated device, while it improves the yield compared to the conventional locally-modulated device. Further, by arranging the LED modules 10 as explained from the FIG. 3 to FIG. 9 in two dimensions, its thickness is less than 5 mm and it is thinner than conventional devices.

Also, since the LED modules 10 release the heat generated by the LEDs 22 to the aluminum base substrate 13 via the electrode aluminum piece 23, the durability of LEDs 22 increase.

The backlight device 1 as explained above is applied to the LCD device as shown below.

Figure 11:
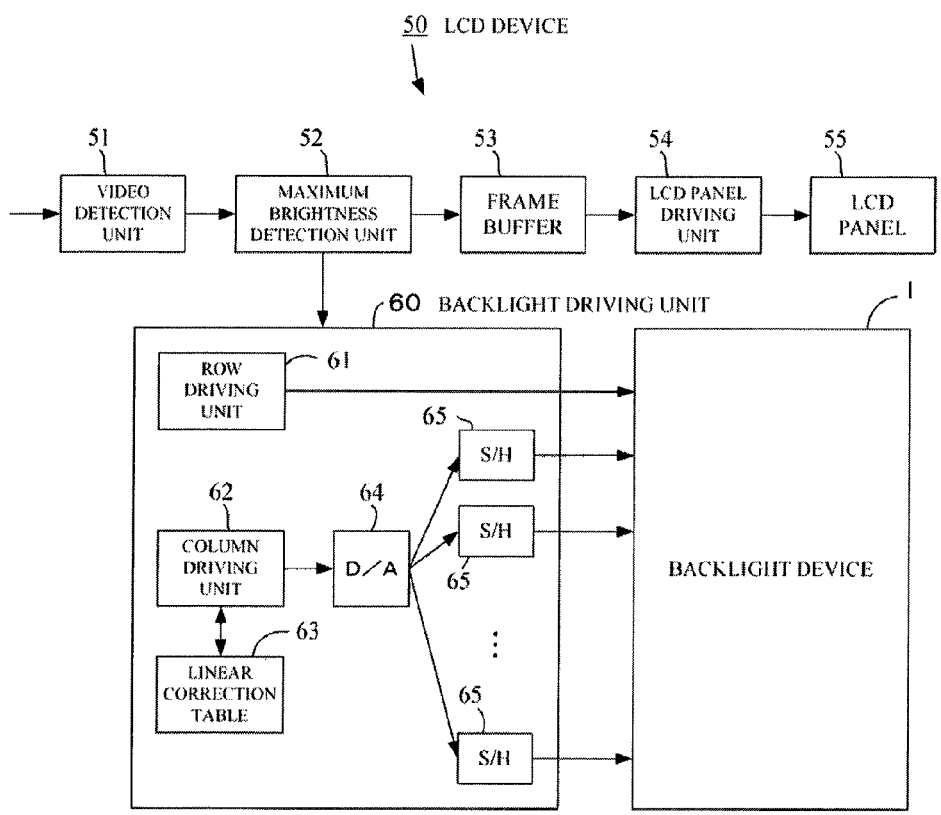
FIG. 11 is a block diagram which shows a functional composition of the LCD device utilizing the backlight device.

FIG. 11 is a block diagram which shows a functional composition of the LCD device 50 utilizing the backlight device 1.

The LCD device 50 has a video detection unit 51 which decodes graphic data of video which is input, a maximum brightness detection unit 52 which detects the maximum brightness with each predetermined pixel, a frame buffer 53 which temporary stores graphic data, LCD panel driving unit 54 which drives an LCD panel 55 based on the graphic data stored in the frame buffer 53, an LCD panel 55 which displays graphics, a backlight driving unit 60 which drives the backlight device 1, and the backlight device 1 which emits light to the LCD panel 55. It is not shown in the FIG. 11, but the LCD panel 55 and the backlight device 1 are synchronized together.

Figure 12:
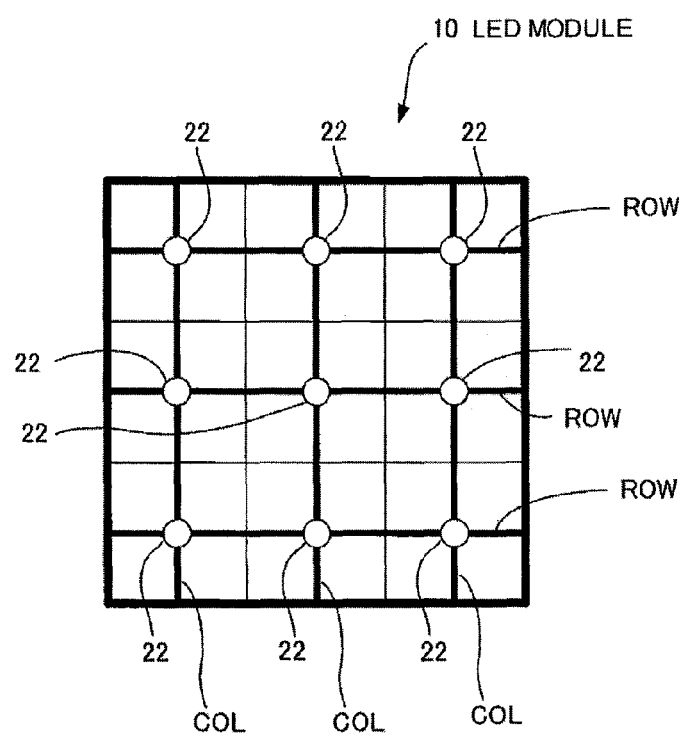
FIG. 12 is a simplified view of the LED module on which LEDs are arranged.

FIG. 12 is a simplified view of the LED module 10 (FIG. 3) on which LEDs 22 are arranged. LEDs 22 are showed in circles. LEDs 22 in the row direction are connected by the row line ROW and LEDs 22 in the column direction are connected by the column line COL.

Figure 13:
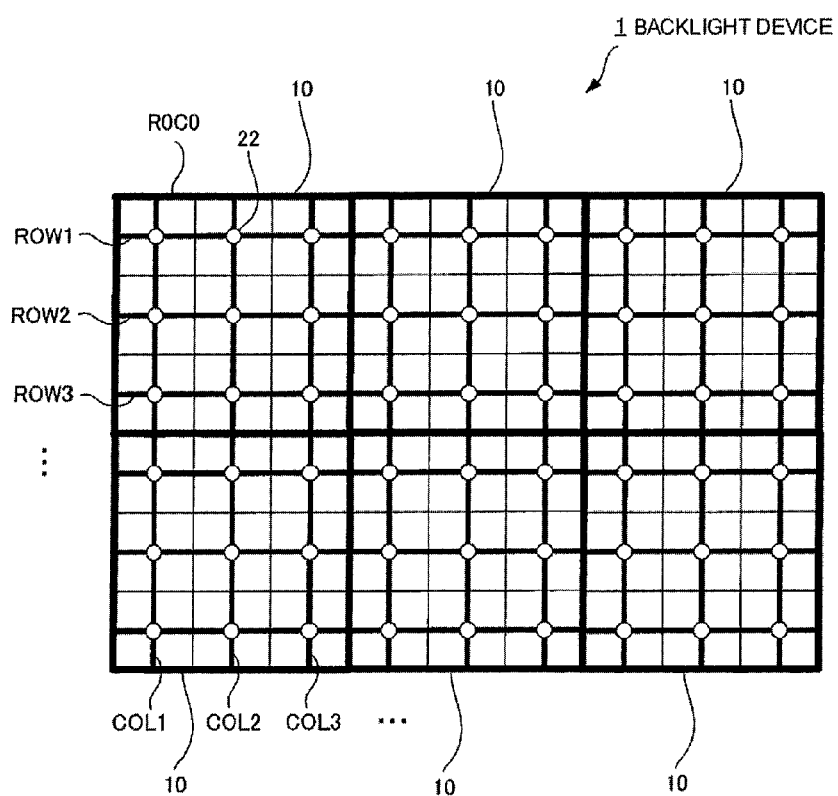
FIG. 13 is a simplified view of the backlight device on which LED modules are aligned.

FIG. 13 is a simplified view of the backlight device 1 on which LED modules 10 are aligned. As for the backlight device 1, as shown in FIG. 13, the column lines COL are indicated as COL0, COL1, COL2, and so forth from the left to the right, and the row lines ROW are indicated as ROW0, ROW1, ROW2, and so forth from the top to the bottom. As for the brightness of the LEDs 22, it is adjustable by changing the voltage of the capacitors C explained later. All the capacitors C on the same row line ROW are refreshed all together at once.

Figure 14:
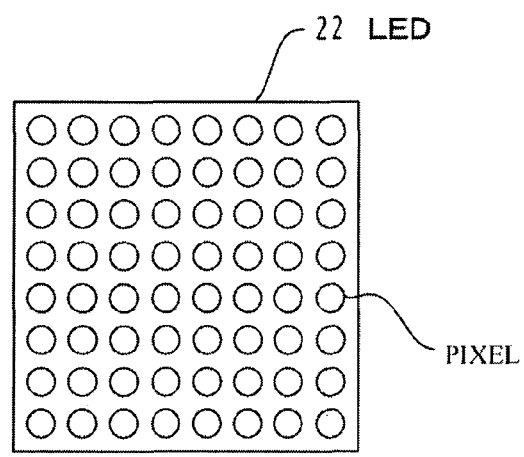
FIG. 14 is a view of 64 pixels which emit lights to a single LED.

FIG. 14 is a view of 64 pixels which emit lights to a single LED 22. Each pixel on the LCD panel 55, compared to each LED of the backlight device 1, has a higher density and a higher resolution. Thus, a single LED 22 emits light to a plurality of pixels (for example, 64 pixels (8 rows by 8 columns) of the LCD panel 55. The number of pixels to which a single LED 22 emits light is not limited to 64 and it can be any other number.

(Circuit Composition of the LED Module 10)

Figure 15:
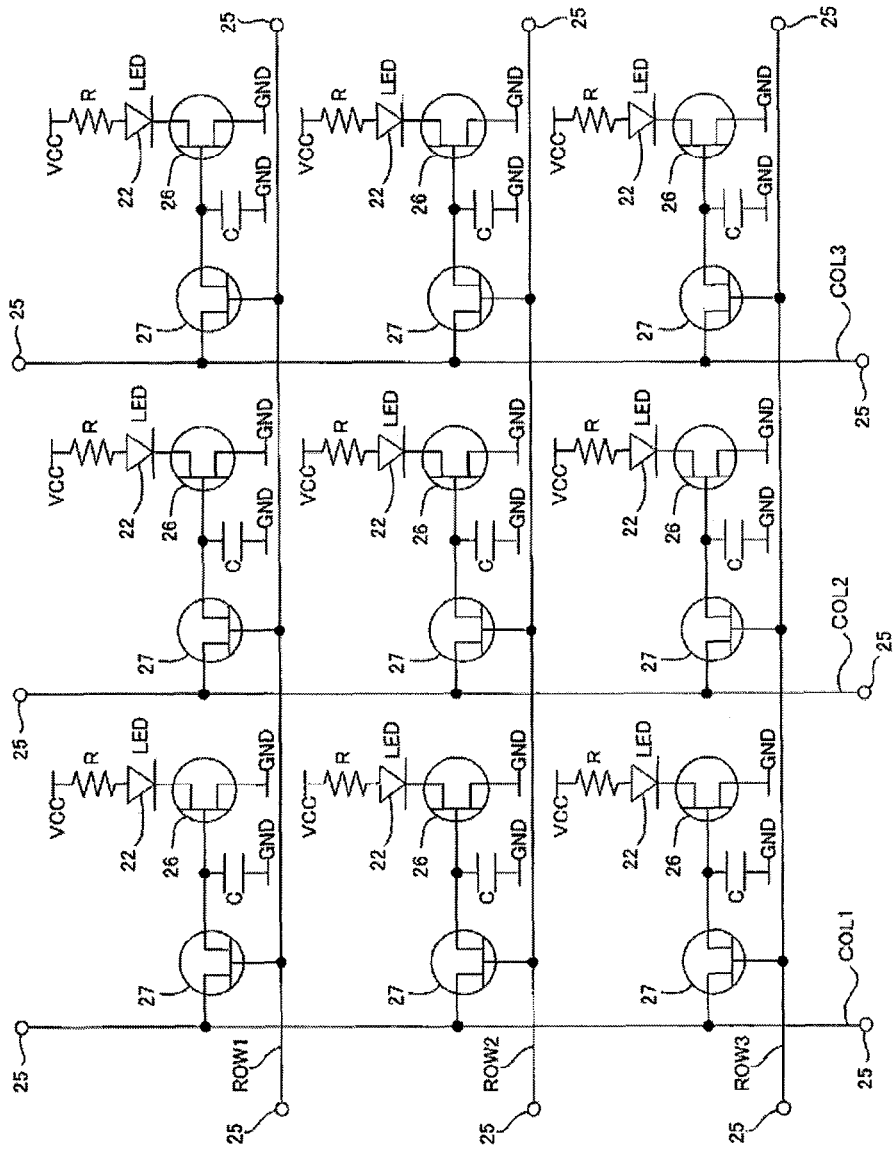
FIG. 15 is a view showing a detailed circuit composition of the LED module.

FIG. 15 is a view showing a detailed circuit composition of the LED module 10.

As shown in FIG. 15, the LED module 10 has LEDs 22 where three of which are arranged in the row direction and in the column direction, three column lines COL1-COL3 which are wired in the longitude direction, three row lines ROW1-ROW3 which are wired in the latitude direction, field effect transistors (FET) 26 and 27 which are switch elements, and capacitors C to which electric charges are accumulated corresponding to the brightness of LEDs 22.

The column lines COL1-COL3 are analog lines which transmit signals depending on the brightness of the LEDs 22 and The column lines COL1-COL3 are connected to the control circuit 12 which are shown in FIG. 1. Row lines ROW1-ROW3 are digital lines which transmit signals specifying the rows to become the scan object and are connected to the control circuit 11 shown in FIG. 1. And when the column lines COL1-COL 3 and row lines ROW1-ROW 3 are activated, LEDs 22 illuminate with controlled brightness.

(The Wiring Composition of LED 22)

Next, the wiring composition of the LED 22 which is driven by the row line ROW 1 and the column line COL1, is explained. Detailed explanations are omitted but the other LEDs 22 are similarly wired.

The power supply voltage VCC is applied to the LED 22 anode via a resistance R. LED 22 cathode is connected to the drain of the field effect transistor (FET) 26. The source of FET 26 is grounded. The gate of FET 26 is grounded via a condenser C as well as connected to the source of FET 27. The gate of FET 27 is connected to the row line ROW1 and the drain of the FET 27 is connected to the column line COL1.

(LED 22 Control of Drive)

As for the LED module 10 which is composed as explained above, the LED 22 is driven as follows; here, the LED 22 driven by the column line COL1 and the row line ROW1 (LED 22 on the top left of FIG. 15) is explained.

First, the voltage (analog signal) corresponding to the brightness of the LED 22 is applied to the column line COL1.

Next, the row line ROW1 becomes to the H level (logic 1). Thus, the FET 27 is turned on, and charges are accumulated to the capacitor C from the row line ROW 1 and thus, the predetermined voltage is applied to the capacitor C.

And when the row line ROW 1 becomes to the L level (logic 0), the FET 27 is turned off, and the capacitor C is cut off from the column line COL1. Thus, when the voltage of the row line ROW 1 is changed later, the voltage in the capacitor C is maintained for a certain period of time. As the FET 26 transmits the electric current corresponding to the voltage of the capacitor C from the gate to the drain, the brightness of the LFE 22 is controlled depending on the voltage of the capacitor C.

Thus, for example, when the voltage values of the column lines COL0, COL1, COL2 . . . are set as V0, V1, V2 . . . in order, and next, when the voltage value of the row line ROW0 is set from L level to H level, and from H level to L level, the voltage value of the capacitor C which corresponds to the row line ROW0 is set to V0, V1, V2 . . . at once. As a result, the brightness of each LED 22 which corresponds to the row line ROW0 is changed at once.

After that, it is possible that the voltage of row lines ROW 1, ROW2, ROW3 . . . are refreshed in such order, or it is possible that it is refreshed in another order, such as ROW1, ROW3, ROW2, ROW4 . . . (interlace).

In FIG. 15, the column line COL1 controls the brightness of the LEDs 22 and the row line ROW1 selects the (line of the) LEDs 22 to be illuminated, but it is possible to choose a formation that the row line ROW 1 controls the brightness of the LEDs 22 and the column line COL1 selects the (line of the) LEDs 22 to be illuminated.

(Behavior of the LCD Device 50)

The LCD device 50 whose composition is explained above behaves as follows;

The video detection unit 51 decodes graphic data of video which is input. The maximum brightness detection unit 52 detects the maximum brightness from 64 pixels of the graphic data which is decoded by the video detection unit 51.

Figure 16:
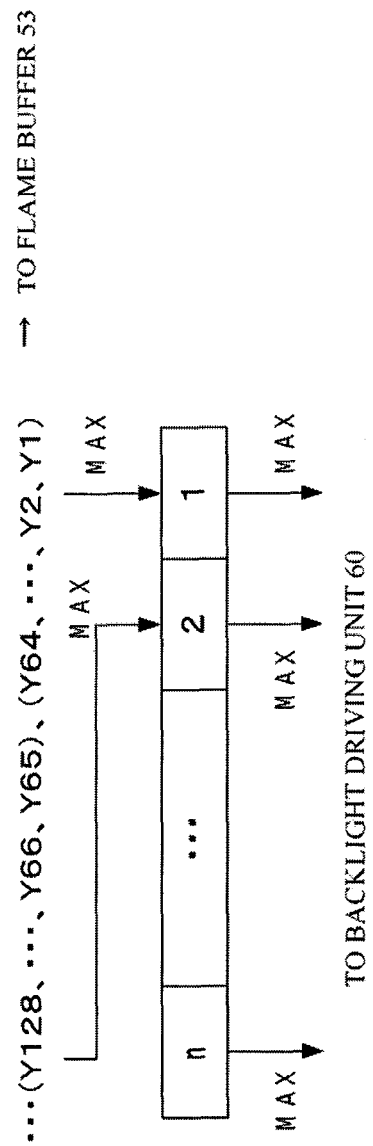
FIG. 16 is a view explaining the maximum brightness detection unit.

FIG. 16 is a view explaining the maximum brightness detection unit 52. The maximum brightness detection unit 52 has a storage area which stores the same number of integer arrays as LEDs 22 (brightness level) in the internal RAM. The maximum brightness detection unit 52 detects the brightness of each 64 pixels, and store the maximum brightness into the storage area. In short, when the brightness Y1, Y2 which form the pixel line are input, the maximum brightness detection unit 52 compares them with the brightness stored in the storage area, and when the brightness which is input is larger than the brightness which is stored, the brightness which is input is newly stored (renewed).

In concrete, the maximum brightness detection unit 52 detects the maximum brightness Y from the 64 pixels as brightness Y1, Y2 . . . Y64 and stores the maximum brightness Y in the storage area 1. Similarly, the maximum brightness detection unit 52 detects the maximum brightness Y from the next 64 pixels as brightness Y65, Y66 . . . Y128 and stores the maximum brightness Y in the storage area 2. And the maximum brightness detection unit 52 outputs the brightness of each pixel Y1, Y2 . . . to a frame buffer 53 as it is, while each brightness stored in the storage area 1, 2 . . . is output to the backlight driving unit 60.

As a result, when one frame is processed, the maximum brightness of each LDE 22 is stored in the storage area 1, 2 . . . and such brightness is output to the backlight driving unit 60. And when the frame scan starts, the brightness of the storage area is initialized to 0.

The backlight driving unit 60, as shown in FIG. 11, has the row driving unit 61 which drives the row line ROW of the backlight device 1, the column driving unit 62 which drives the column line COL of the backlight device 1, a linear correction table 63 for linear correction, and a D/A converter 64 which converts digital signals to analog signals, and a plurality of sample hold (S/H) circuits 65.

The row driving unit 61 drives the control circuit 12 (column line COL) based on the maximum brightness detected by the maximum brightness detection unit 52 and the driving timing.

The column driving unit 62 refers to the linear correction table 63 and converts the maximum brightness which is output by the maximum brightness detection unit 52 to a voltage of digital signal, and outputs to the D/A converter 64. Here, since the relation between the brightness and the voltage is not linear, the relation between the brightness needs to be predefined. And then the linear correction table 63 memorizes the table data which defines the relation between the brightness and the voltage. The column driving unit 62, based on the table data, reads the voltage which corresponds to the maximum brightness and outputs the relevant voltage.

The D/A converter 64 converts the digital signal (voltage value) which is output from the column driving unit 62 to an analog signal (voltage value) and outputs the converted voltage to each s/h circuits 65. At that time, the D/A converter 64 outputs the voltage which drives each column line COL of the backlight device 1 chronologically and in a continued manner.

The number of S/H circuits 65 corresponds to the number of column line COL of the backlight device 1. Each S/H circuits 65, when driving the corresponding column line COL, holds the voltage which is output from the D/A converter 64 at its unique timing, and outputs the voltage which is held as such to the corresponding column line COL (control circuit 11).

Here, the D/A converter is expensive, and when the dedicated D/A converter is provided to each column line COL of the backlight device 1, it becomes high in cost. Thus, the D/A converter 64 outputs the voltage of each column line COL in a chronological manner and the S/H circuit corresponding to each column line COL holds the voltage from the D/A converter 64 at an appropriate timing and outputs such voltage. As such, there is no need for dedicated D/A converter 64 to each column line COL and it becomes possible to drive the column lines COL.

As explained above, the backlight device 1 detects the maximum brightness from the plurality of pixels corresponding to one LED 22, and drives the LED 22 to achieve this maximum brightness. As such, the backlight device 1 illuminates with the optimal strength of light to the LCD panel 55 depending on its brightness.

With a conventional backlight device, when there are a plurality of bright spots in the dark screen, such as when stars are shining in the dark sky, the average brightness of the entire screen is low, and the entire screen becomes dark and the brightness of the stars are not enough.

On the other hand, the backlight device 1 of this embodiment controls the brightness of the LEDs 22 so that it achieves the maximum brightness of a plurality of corresponding pixels, thus while the entire screen remains dark, it is possible to make only the brightness of the starts high and provide a clear beautiful view of stars shining in the dark sky on a display.

Also, the backlight device 1 has corresponding S/H circuits 65 which corresponds to each of the column line COL, and as each S/H circuit 65 samples and holds the voltage of each column line COL, there is no need for dedicated D/A converter 64 for each column line COL, and the LED 22 is driven by a low cost circuit composition.

The maximum brightness detection unit 52 detects the maximum brightness among the 64 pixels, but for example, if there is any pixel which has a brightness which is over a predetermined level (for example, more than 95% of the maximum limit) among such 64 pixels, it is possible to detect such voluntary brightness over the predetermined level regardless of the maximum brightness. Such predetermined level is not limited to over 95%, and it is changeable to any level depending on the environment (how much light) of the LCD device 50.

The backlight device 1 as explained above adopts the analog format which controls the brightness of the LEDs 22 depending on the level of analog signals, but it is possible to adopt other formats, such as the digital format with the PWM (Pulse Width Modulation) which controls the brightness of the LEDs 22 by the duty ratio of digital signals. As such, the backlight device 1 is turned on only as needed by the LEDs 22 and thus the power consumption is maintained low.

This embodiment is not limited to the backlight device of the embodiment explained above, but it is possible to apply the backlight device to general illumination devices as indicated in the second embodiment.

Second Embodiment

Next, the second embodiment of the present invention is explained. As for the same portions as the first embodiment, same symbols are used, and duplicated explanations are omitted.

The illumination device according to the second embodiment is mostly composed in a similar manner as the backlight device 1 shown in FIG. 1, but what is different from the first embodiment is that it is set either indoors or outdoors. The explanation here is given mainly on the different points compared to the first embodiment.

The illumination device of the second embodiment has the LED modules 10 as explained as follow so that even if one of the LED modules 10 breaks, the power source voltage is continuously supplied to other LED modules 10 which are adjacent to such broken LED module 10.

Figure 17:
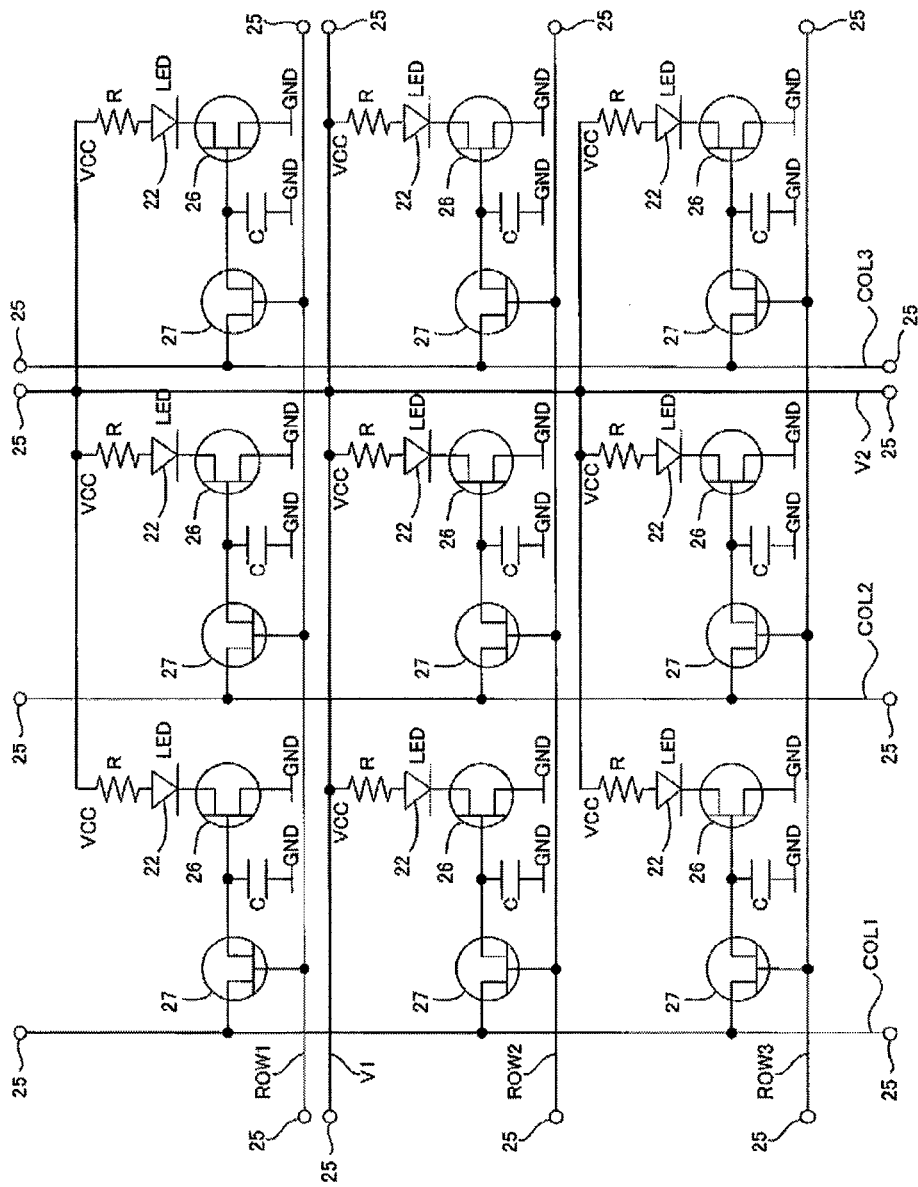
FIG. 17 is a circuit diagram of the LED module of the second embodiment.

FIG. 17 is a circuit diagram of an LED module 10 of the second embodiment. The LED modules 10 of the second embodiment are formed almost in a similar manner as show on in FIG. 15, and further, has a row direction voltage supply line V1 and a column direction voltage supply line V2. The row direction voltage supply line V1 and the column direction voltage supply line V2 are connected inside the LEDs module 10. In concrete, the horizontal direction power source supply line V1 and the column direction power source supply line V2 are provided in the multi-layer substrate 26 shown in FIG. 19 and FIG. 22 which are explained later.

The row direction voltage supply line V1 is connected from one end of the row direction of the LED module 10 (interface internal terminal 25) to the other end of the row direction (interface internal terminal 25). The column direction voltage supply line V2 is connected from one end of the column direction of the LED module 10 (interface internal terminal 25) to the other end of the column direction (interface internal terminal 25).

One end of each resistance R in the LED module 10 (the side which is not connected to the LED 22) is connected to the column direction voltage supply line V2. Therefore, the power source voltage VCC is applied to each resistance R in the LED module 10. It is possible that one side of each resistance R is connected to the row direction voltage supply line V1, not to the column direction voltage supply line V2.

Therefore, the LED module 10 applies the power source voltage VCC to each resistance R in the LED module 10 when the power source voltage VCC is supplied from the adjacent LED module 10. LED module 10 provides power source voltage to each of three adjacent LED modules 10.

Also, the scope of the illumination device of this embodiment is not only for lighting certain objects but also includes other functionalities, such as taking photo images of certain objects and wirelessly communicating such photo image information. The illumination device of this embodiment has a sensor module 70 to take photo images of certain objects.

Figure 18:
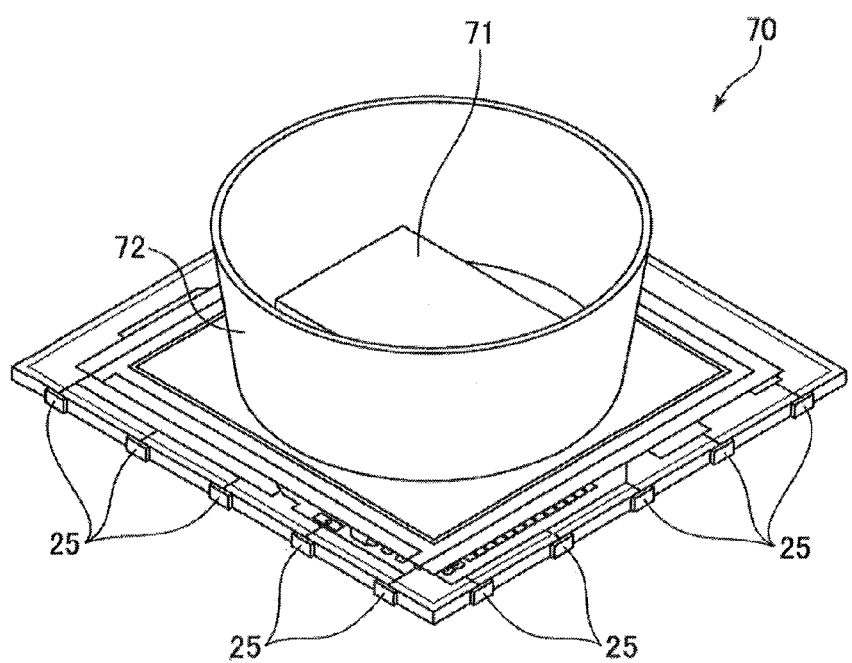
FIG. 18 is a perspective view of a sensor module.
Figure 19:
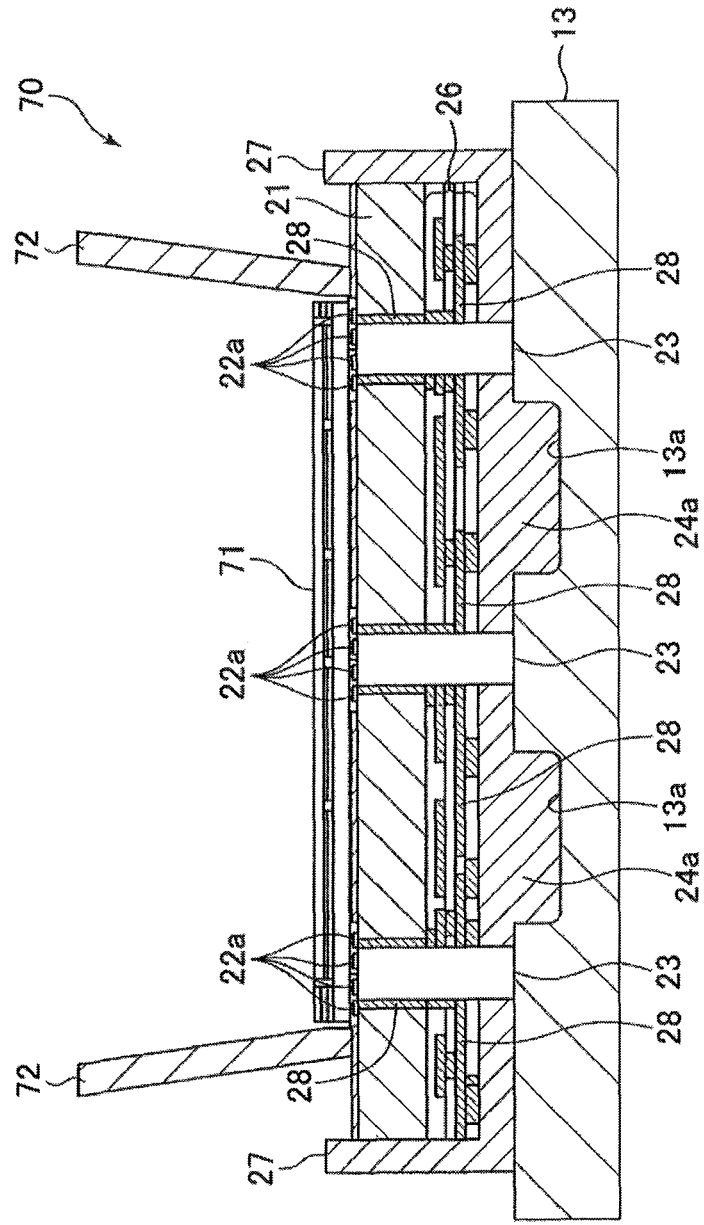
FIG. 19 is a cross sectional view of the sensor module.

FIG. 18 is a perspective view of a sensor module 70. FIG. 19 is a cross sectional view of the sensor module 70. The size of the sensor module 70 is the same as the LED module 10, and similarly to the LED module 10, it is attachable to and detachable from the aluminum base substrate 13. Therefore, in this embodiment, a plurality of LED modules 10 which are provided to the illumination device of the first embodiment are replaced by the sensor modules 70.

Sensor module 70 is composed similarly as shown in FIG. 9, but instead of LEDs 22 shown in FIG. 9, it has a CMOS sensor 71 and hoods 72 as shown in FIG. 19.

CMOS sensor 71 is connected to the electrode aluminum piece 23 via micro bumps 22a. Therefore, the heat generated at the CMOS sensor 71 is released to outside via micro bumps 22a, electrode aluminum piece 23, and the aluminum base substrate 13.

Hoods 72 are arranged on the organic substrate 21 in such a manner that hoods 72 surround the edges of the CMOS sensor 71. By this, the light from the LED modules 10 which are arranged around the sensor module 70 does not get into the CMOS sensor 71.

Figure 20:
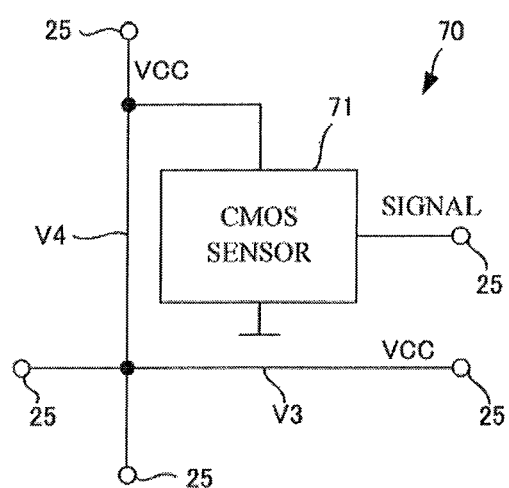
FIG. 20 is a circuit diagram of the sensor module.

FIG. 20 is a circuit diagram of the sensor module 70. Sensor module 70 has a CMOS sensor 71, the row direction voltage supply line V3, and the column direction voltage supply line V4. The row direction voltage supply line V3 and the column direction voltage supply line V4 are connected inside the sensor module 70.

The row direction voltage supply line V3 is connected from one end of the row direction of the sensor module 70 (interface internal terminal 25) to the other end of the row direction (interface internal terminal 25). The column direction voltage supply line V4 is connected from one end of the column direction of the sensor module 70 (interface internal terminal 25) to the other end of the column direction (interface internal terminal 25).

CMOS sensor 71 is connected to the column direction voltage supply line V4. It is possible that the CMOS sensor 71 is connected to the row direction voltage supply line V3, not to the column direction voltage supply line V4. And the CMOS sensor 71 generates graphic signals corresponding to the light from the object and outputs these graphic signals via the interface internal terminal 25.

Therefore, the sensor module 70, when the power source voltage VCC is supplied to the adjacent LED module 10, applies the power source voltage VCC to the CMOS sensor 71 in the sensor module 70. Further, the sensor module 70 supplies to power source supply voltage to each of the three other adjacent LED modules 10.

Further, the illumination device of this embodiment has a wireless LAN module 80 to realize wireless communication functionality.

Figure 21:
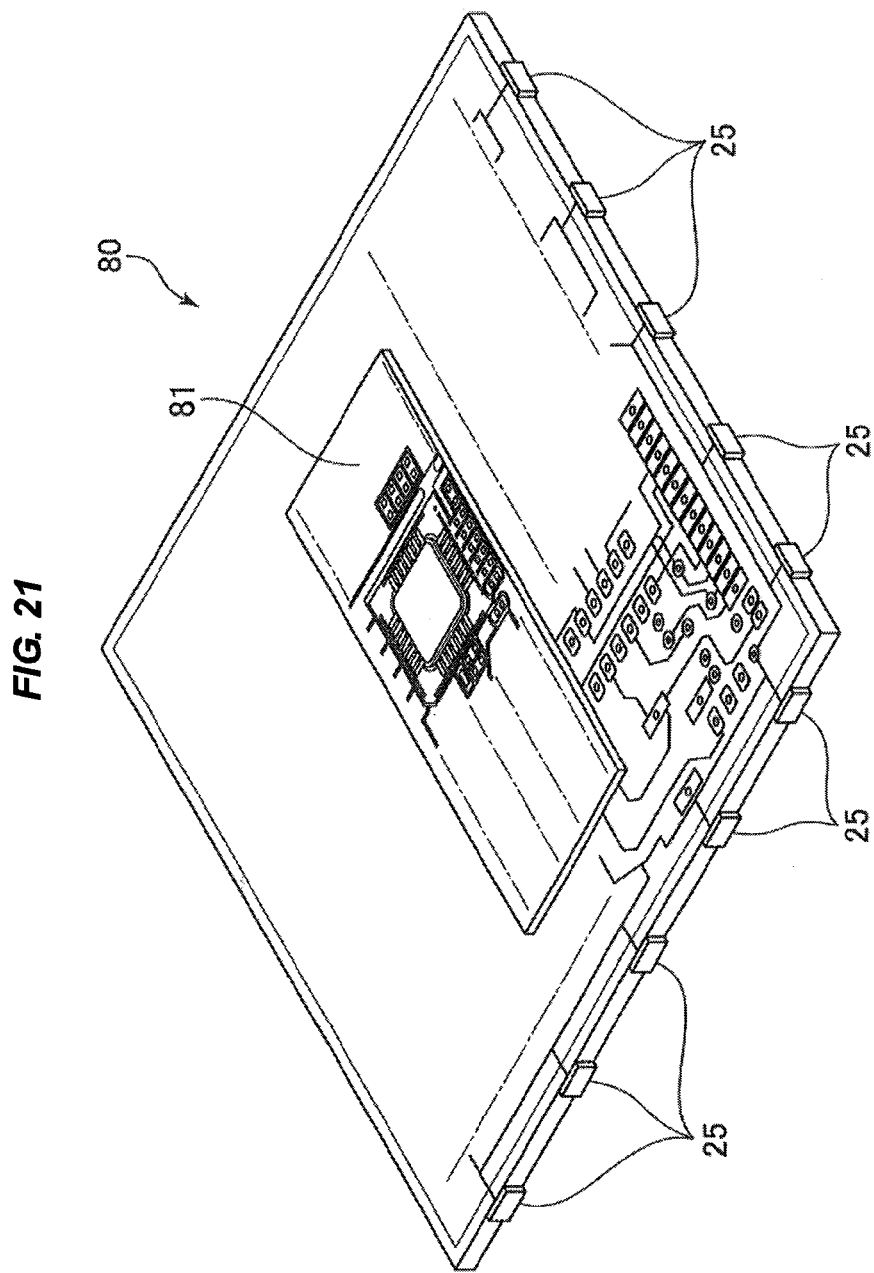
FIG. 21 is a perspective view of a wireless LAN module.
Figure 22:
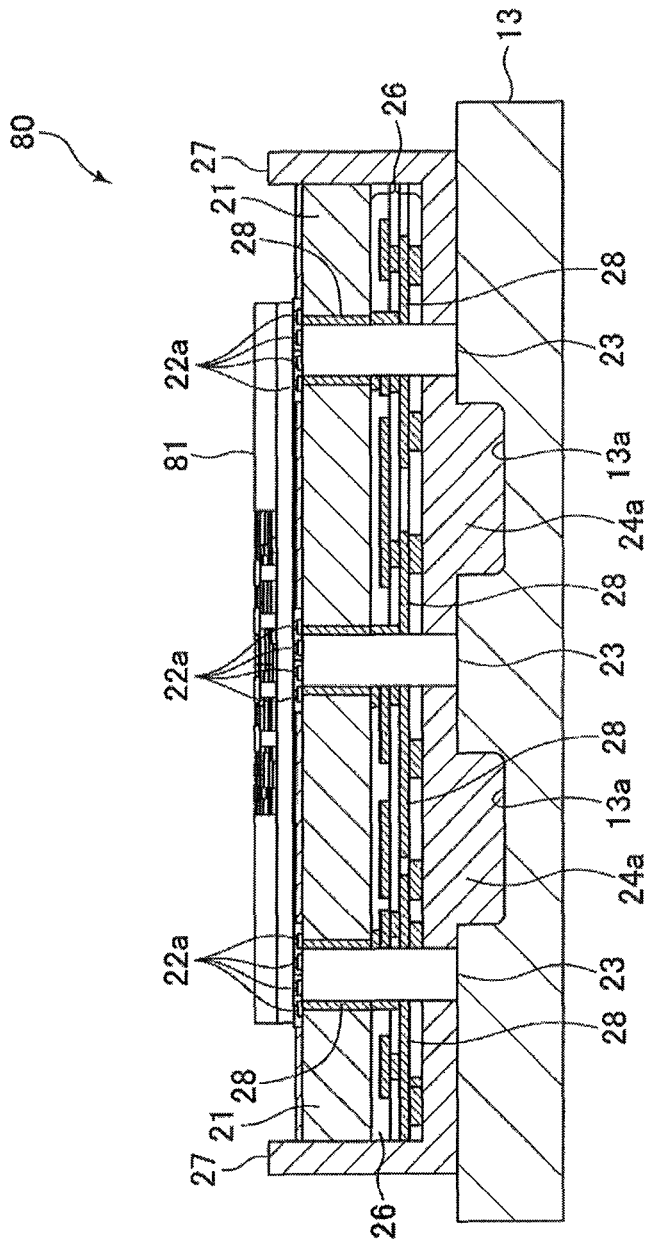
FIG. 22 is a cross sectional view of the wireless LAN module.

FIG. 21 is a perspective view of a wireless LAN module 80. FIG. 22 is a cross sectional view of a wireless LAN module 80. The size of the wireless LAN module 80 is the same as the LED module 10, and similarly to the LED module 10, it is attachable to and detachable from the aluminum base substrate 13. Therefore, in this embodiment, a plurality of LED modules which are 10 provided to the illumination device of the first embodiment are replaced to wireless LAN modules 80.

The wireless LAN module is composed almost similarly as shown in FIG. 9, but it has a wireless LAN chip 81 as shown in FIG. 22 instead of LEDs 22 shown in FIG. 9.

The wireless LAN chip 81 is connected to the electrode aluminum piece 23 via micro bumps 22a. Therefore, the heat generated by the wireless LAN chip 81 is released to outside via micro bumps 22a, the electrode aluminum piece 23, and the aluminum base substrate 13.

Figure 23:
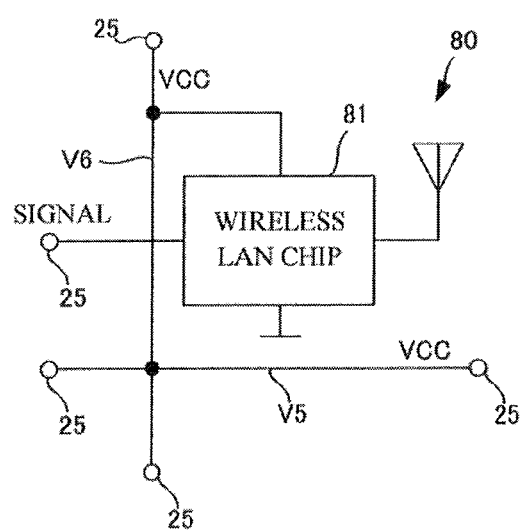
FIG. 23 is a circuit diagram of the wireless LAN module.

FIG. 23 is a circuit diagram of the wireless LAN module 80. The wireless LAN module 80 has the wireless LAN chip 81, the row direction voltage supply line V5, and the column direction voltage supply line V6. The row direction voltage supply line V5 and the column direction voltage supply line V6 are connected inside the wireless LAN module 80.

The row direction voltage supply line V5 is connected from one end of the row direction of the wireless LAN module 80 (interface internal terminal 25) to the other end of the row direction (interface internal terminal 25). The column direction voltage supply line V6 is connected from one end of the column direction of the wireless LAN module 80 (interface internal terminal 25) to the other end of the column direction (interface internal terminal 25).

The wireless LAN chip 81 is connected to the column direction voltage supply line V6. It is possible that the wireless LAN chip 81 is connected to the row direction voltage supply line V5, not to the column direction voltage supply line V6. And the wireless LAN chip 81 communicates to its receiver when graphic signals are input from the CMOS sensor 71.

Therefore, the sensor module 70, when the power source voltage VCC is supplied to the adjacent LED module 10, applies the power source voltage VCC to the CMOS sensor 71 in the sensor module 70. Further, the sensor module 70 supplies the power source supply voltage to each of the three other adjacent LED modules 10.

As explained above, as for the illumination device of the second embodiment, a plurality of LED modules 10 which have a row direction voltage supply line V1 and a column direction voltage supply line V2 which are connected to each other, are arranged in the row direction and in the column direction. Each LED module 10, when the power source voltage VCC is supplied by the adjacent LED module 10, supplies the power source voltage VCC to adjacent other three LED modules.

Thus, even if one of the voluntary LED modules 10 breaks, the LED modules to which the broken LED module 10 supplied the power source voltage VCC, receive supply of the power source voltage VCC by other adjacent LED modules 10. In short, even if one of the voluntary LED modules 10 breaks, it is prevented that the supply of the power source voltage VCC is cut off to adjacent LED modules 10.

Also, the illumination device of the second embodiment, by having the sensor module 70 and the LAN module 80 in addition to the LED modules 10, functions not only as a lighting device but also a surveillance camera which is hard detect from outside.

It is possible that the illumination device explained above has a human detection sensor, a magnetic sensor, a thermal sensor, a vibration sensor, a smoke sensor, an electromagnetic sensor, an earthquake sensor, and so on, instead of the sensor module 70. In such case, the wireless LAN module 80 wirelessly communicates signals detected by either of these sensors to other device.

Also, it is possible that the wireless LAN module 80 has a functionality to receive signals which are wirelessly transmitted from a dedicated wireless LAN module and to wirelessly transfer such signals to other wireless LAN module. As such, the illumination device explained above serves as a small-size wireless base station. Also, the wireless LAN module 80 only needs wireless communication functionality, and for example, either of Wi-Fi$^{TR}$, millimeter wave communication device, or PHS electric wave relaying chip would work.

Further, as the illumination device of the second embodiment is composed in such a manner as explained above, for example, its thickness is less than 5 mm, and therefore thinner than conventional illumination devices. Thus, it is possible to use the illumination device in such a manner that it is embedded into the indoor ceiling of a building, or indoor and outdoor walls. In addition, when the illumination device is embedded into an outdoor wall of a building, it is possible to use LED modules instead of exterior wall tiles. In such case, the building itself functions as an illumination device and provides light to adjacent buildings. Also, it is possible to apply the present invention to an illumination device for projection devices.

In this embodiment, the LEDs 22 are connected to wires 28 or electrode aluminum piece 23 via micro bumps 22a but it is possible to connected them by wire bonding.

REFERENCE SIGNS LIST

1 backlight device
10 LED module
13 aluminum base substrate
22 LED
23 electrode aluminum piece
50 LCD device
52 maximum brightness detection unit
55 LCD panel
60 backlight driving unit
70 sensor module
80 wireless LAN module

The invention claimed is:

1. An illumination device comprising:
(a) a metal base substrate in a flat planar shape;
(b) a plurality of LED modules which each include:
an organic substrate;
a plurality of LEDs which are arranged on the organic substrate;
a plurality of metal members each of which is associated with a respective one of the LEDs and to which heat from the respective LEDs is conducted, the metal members each being electrically connected via a respective switch element to an electrode of the respective LED, and the metal members each penetrating the organic substrate in a width direction from an LED mounting surface of the organic substrate and being exposed from an opposite surface thereof;
LED control signal terminals which are set on an edge of the organic substrate; and
voltage feed terminals which are set on the edge of the organic substrate;
wherein the LED modules are arranged along the row direction and the column direction so as to be capable of attaching to and detaching from the metal base substrate, and
wherein the LED control signal terminals and the voltage feed terminals which are adjacent to each other in the row direction and in the column direction are connected to each other and to a respective one of the LEDs via a respective switching circuit; and
(c) a driving unit which drives each of the LEDs arranged on the metal base substrate.

2. The illumination device according to claim 1, further comprising:
a brightness detection unit to detect a maximum brightness or a brightness which is over a predetermined level from a plurality of pixels corresponding to each LED,
wherein the driving unit drives each LED so that each LED achieves the level of brightness which is detected by the brightness detection part.

3. The illumination device according to claim 1, wherein the driving unit comprises:
a converter which converts the voltage from each control line which drives LEDs in the row direction or in the column direction from digital signals to analog signals; and
a sample hold circuit which holds the voltage which is output from the converter at its unique predetermined timing, and outputs such voltage to the corresponding control line.

4. The illumination device according to claim 1,
wherein, the LED module which has the first voltage supply line which connects two voltage supply terminals which are facing with each other in the row direction and the second voltage supply line which connects two voltage supply terminals which are facing with each other in the column direction as well as which connects to the first voltage supply line.

5. The illumination device according to claim 1, further comprising:
a wireless radio transmission/reception module which relays wirelessly transmitted signals.

6. The illumination device according to claim 1, further comprising:
a sensor module which has an image sensor which images a subject; and
a wireless radio transmission/reception module which transmit radio signals which are output from the image sensor.

7. A liquid crystal display device comprising:
a liquid crystal panel with a plurality of pixels; and
the illumination device of claim 1 which emits light toward the liquid crystal panel.

\* \* \* \* \*